United States Patent
Ko

(10) Patent No.: US 8,873,305 B2
(45) Date of Patent: Oct. 28, 2014

(54) SEMICONDUCTOR MEMORY DEVICE HAVING DATA COMPRESSION TEST CIRCUIT

(75) Inventor: Bok Rim Ko, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 351 days.

(21) Appl. No.: 13/337,657

(22) Filed: Dec. 27, 2011

(65) Prior Publication Data

US 2012/0195133 A1  Aug. 2, 2012

(30) Foreign Application Priority Data

Jan. 28, 2011 (KR) .................. 10-2011-0008848

(51) Int. Cl.
*G11C 7/10* (2006.01)
*G11C 29/40* (2006.01)

(52) U.S. Cl.
CPC .................................... *G11C 29/40* (2013.01)

USPC ................ 365/189.05; 365/189.02; 365/193; 365/201; 365/230.02

(58) Field of Classification Search
USPC ........... 365/189.02, 189.05, 201, 230.02, 193
See application file for complete search history.

(56) References Cited

U.S. PATENT DOCUMENTS 6,850,444 B2 * 2/2005 Cho .......................... 365/189.05

* cited by examiner

*Primary Examiner* — Tha-O H Bui
(74) *Attorney, Agent, or Firm* — William Park & Associates Patent Ltd.

(57) ABSTRACT

A semiconductor memory device includes a data transmission unit configured to transmit first input data to only a first global line driver or to the first global line driver and a second global line driver in response to a test signal, and a transmission element configured to transmit second input data only to the second global line driver in response to the test signal.

8 Claims, 4 Drawing Sheets

SEMICONDUCTOR MEMORY DEVICE HAVING DATA COMPRESSION TEST CIRCUIT

CROSS-REFERENCES TO RELATED APPLICATIONS

The present application claims priority under 35 U.S.C 119(a) to Korean Application No. 10-2011-0008848, filed on Jan. 28, 2011, in the Korean Intellectual Property Office, which is incorporated by reference in its entirety.

BACKGROUND

Exemplary embodiments of the present invention relate to a semiconductor memory device having a data compression test circuit.

Recently, with the rapid increase in integration of semiconductor memory, a method called a data compression test has been used to test a semiconductor memory device. The data compression test is performed as follows: data having the same logic level are stored in a plurality of cells and then simultaneously outputted to generate a comparison signal.

In the conventional data compression test, when data are stored in a plurality of cells, the data are transmitted through a separate test line coupled between an input buffer and a global line driver. Therefore, during a normal operation, the data are transmitted through a data line between the input buffer and the global line driver, but during a data compression test, the data are transmitted through the separate test line. Accordingly, it is impossible to determine whether a failure occurs in the data line between the input buffer and the global line driver.

Furthermore, in the conventional data compression test, when the comparison signal generated by comparing the data stored in the plurality of cells is outputted, the comparison signal is transmitted through a separate test line coupled between a pipe latch and an output driver. Therefore, during a normal operation, the comparison signal is transmitted through a data line between the pipe latch and the output driver, but during the data compression test, the comparison signal is transmitted through the separate test line. Accordingly, it is impossible to determine whether a failure occurs in the data line between the pipe latch and the output driver.

As such, since the line through which the data and the comparison signal are inputted/outputted during the normal operation and the line through which the data and the comparison signal during the data compression test are not the same, a failure may occur during normal use even though the semiconductor memory device was determined to be normal during the test.

SUMMARY

An embodiment of the present invention relates to a semiconductor memory device having a data compression test circuit capable of increasing the accuracy of a test by performing a data compression test using a line through which data and compression signal are inputted/outputted during normal operation.

In one embodiment, a semiconductor memory device includes: a data transmission unit configured to transmit first input data to only a first global line driver or to the first global line driver and to a second global line driver in response to a test signal; and a transmission element configured to transmit second input data only to the second global line driver in response to the test signal.

In another embodiment, a semiconductor memory device includes: a first data line coupled to a first global line driver; a second data line coupled to a second global line driver; a data transmission unit configured to transmit first input data only to the first data line or to an interline coupled to the first and second data lines in response to a test signal; and a transmission element configured to transmit second input data only to the second data line in response to the test signal.

In another embodiment, a semiconductor memory device includes: a compression unit configured to receive first and second output data and generate a compression output signal; a first output driver configured to buffer the compression output signal and output a buffered compression signal; and a second output driver configured to buffer the second output data and output a buffered second data.

In another embodiment, a method for testing a semiconductor memory device includes: transmitting first input data to only a first global line driver or to the first global line driver and a second global line driver in response to a test signal; and transmitting second input data only to the second global line driver in response to the test signal.

BRIEF DESCRIPTION OF THE DRAWINGS

The above and other aspects, features and other advantages will be more clearly understood from the following detailed description taken in conjunction with the accompanying drawings, in which.

DESCRIPTION OF SPECIFIC EMBODIMENTS

Embodiments of the present invention will be described with reference to accompanying drawings. However, the embodiments are for illustrative purposes only and are not intended to limit the scope of the invention.

Figure 1:
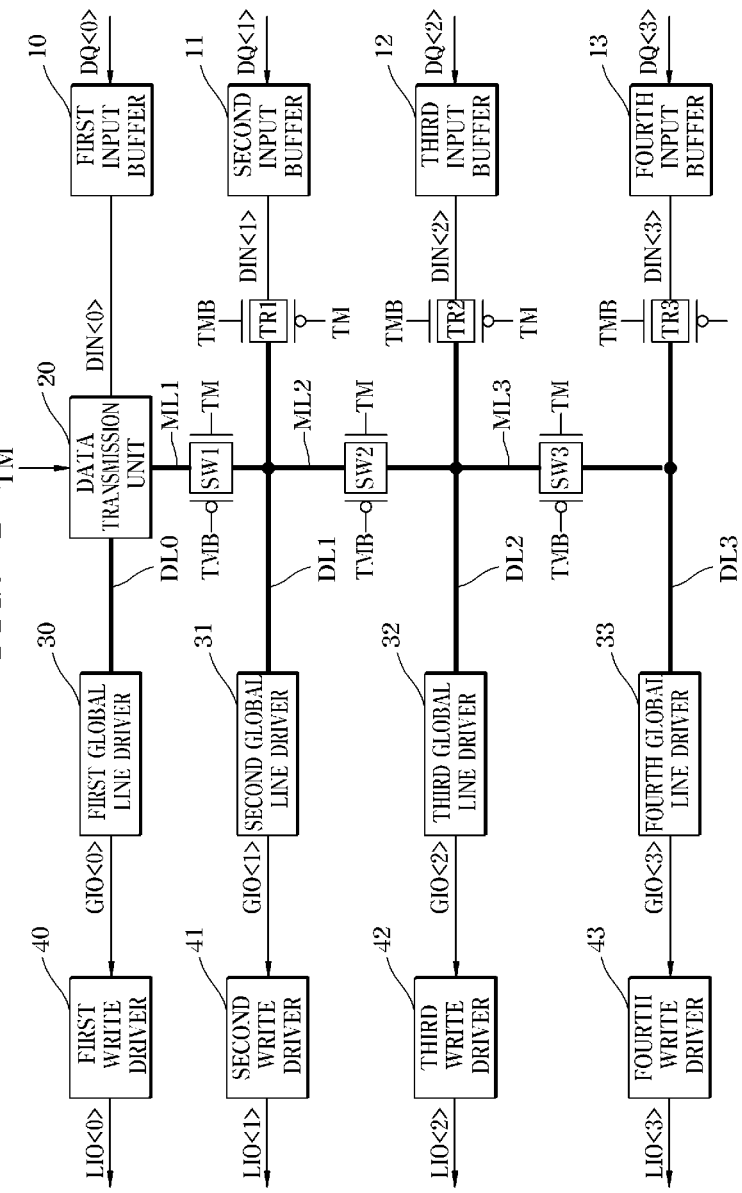
FIG. 1 is a block diagram illustrating a write path of a semiconductor memory device in accordance with an embodiment of the present invention.

FIG. 1 is a block diagram illustrating a write path of a semiconductor memory device in accordance with an embodiment of the present invention.

Referring to FIG. 1, the semiconductor memory device in accordance with an embodiment of the present invention includes first to fourth input buffers 10 to 13, first to third transmission elements TR1 to TR3, a data transmission unit 20, first to fourth global line drivers 30 to 33, and first to fourth write drivers 40 to 43.

The first to fourth input buffers 10 to 13 are configured to buffer first to fourth data DQ<0:3> and generate first to fourth input data DIN<0:3>, respectively. Hereafter, it is assumed that the first data DQ<0> is used to perform a data compression test.

Figure 2:
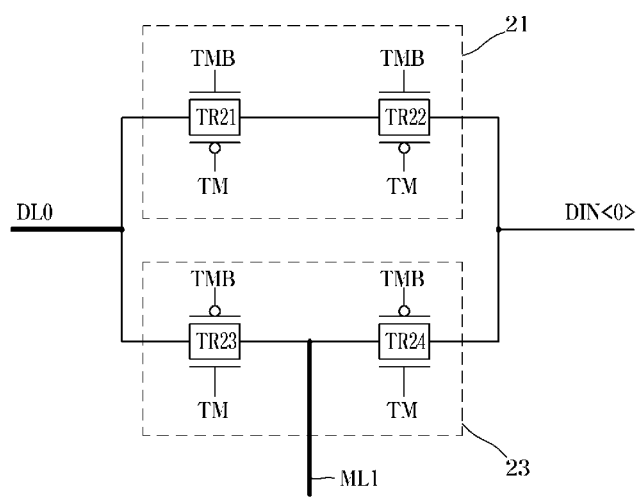
FIG. 2 is a circuit diagram of a data transmission unit of the semiconductor memory device illustrated in FIG. 1.

Referring to FIG. 2, the data transmission unit 20 includes a first transmission section 21 and a second transmission section 23. The first transmission section 21 includes two transmission elements TR21 and TR22. The first data transmission section 21 is configured to transmit the first input data DIN<0> to a first data line DL0 when a test signal TM is deasserted to a logic low level. The second transmission section 23 includes two transmission elements TR23 and TR24.

The second transmission section 23 is configured to transmit the first input data DIN<0> to the first data line DL0 and a first interline ML1 when the test signal TM is asserted to a logic high level. As can be seen in FIG. 1, the first interline ML1 is coupled to a second data line DL1 and a second interline ML2, the second interline ML2 is coupled to a third data line DL2 and a third interline ML3, and the third interline ML3 is coupled to a fourth data line DL3. The third data line DL2 and the fourth data line DL3 are coupled to the third global line driver 32 and the fourth global line driver 33, respectively. The signal TMB is an inverted version of the test signal TM. While it is said to be "asserted to a logic high level," it may also be said to be "deasserted to a logic high level," depending on the convention used. And for a corresponding convention, a signal may be "deasserted to a logic low level" or "asserted to a logic low level."

The data transmission unit 20 is configured to transmit the first input data DIN<0> to the first data line DL0 when the test signal TM is deasserted to a logic low level. Furthermore, the data transmission unit 20 is configured to transmit the first input data DIN<0> to the first to fourth global line drivers 30 to 33, when the test signal TM is asserted to a logic high level.

The first to third transmission elements TR1 to TR3 may be, for example, general transmission gates. When the test signal TM is deasserted to a logic low level, the first to third transmission elements TR1 to TR3 may transmit the second to fourth input data DIN<1:3> to the second to fourth global line drivers 31 to 33, respectively. Furthermore, when the test signal TM is asserted to a logic high level, the first to third transmission elements TR1 to TR3 block the second to fourth input data DIN<1:3>. Additionally, it should be understood that the first to third interlines ML1:3 may comprise circuitry so as to avoid shorting the outputs of the first to third transmission elements TR1 to TR3 when the test signal TM is deasserted to a logic low level. The circuitry may comprise, for example, switching elements SW1, SW2, and SW3 controlled by the test signal TM such that they are closed when the test signal TM is asserted and open when the test signal TM is deasserted.

The first to fourth global line driver 30 to 33 are configured to receive the first to fourth input data DIN<0:3> via the first to fourth data lines DL0:3 to generate first to fourth global line data GIO<0:3>, respectively.

The first to fourth write drivers 40 to 43 are configured to receive the first to fourth global line data GIO<0:3> to generate first to fourth local line data LIO<0:3>, respectively.

Figure 3:
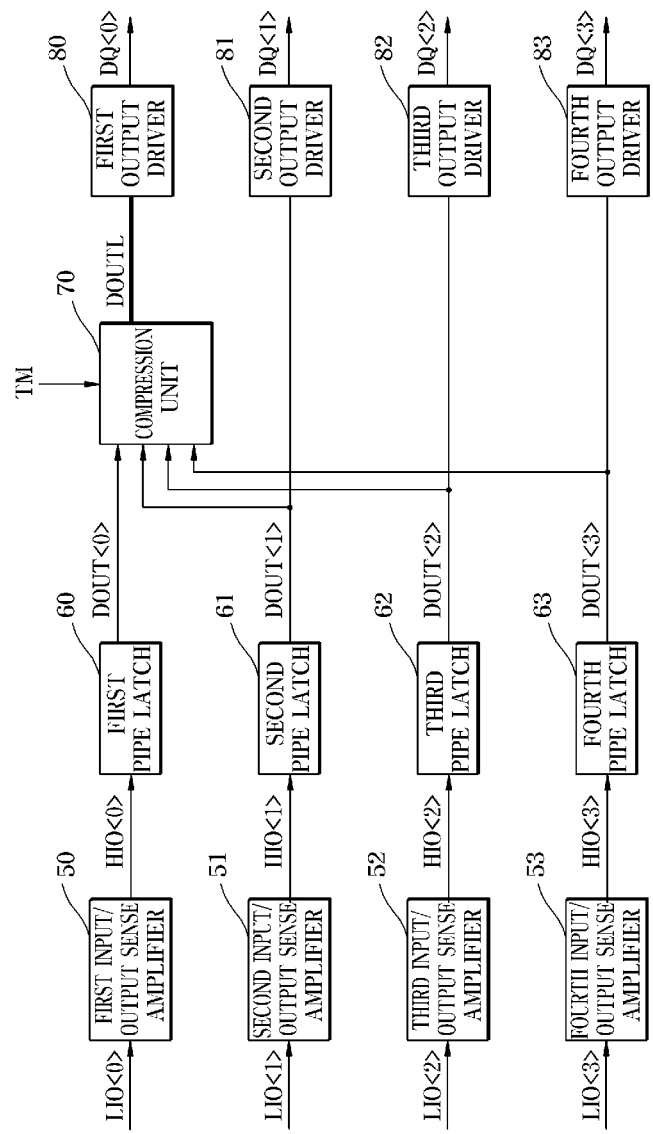
FIG. 3 is a block diagram illustrating a read path of the semiconductor memory device in accordance with an embodiment of the present invention.

FIG. 3 is a block diagram illustrating a read path of the semiconductor memory device in accordance with an embodiment of the present invention.

Referring to FIG. 3, a semiconductor memory device in accordance with an embodiment of the present invention includes first to fourth input/output sense amplifiers 50 to 53, first to fourth pipe latches 60 to 63, a compression unit 70, and first to fourth output drivers 80 to 83.

The first to fourth input/output sense amplifiers 50 to 53 are configured to amplify the first to fourth local line data LIO<0:3> and generate the first to fourth output global line data HIO<0:3>, respectively.

The first to fourth pipe latches 60 to 63 are configured to latch the first to fourth output global line data HIO<0:3> and generate first to fourth output data DOUT<0:3>, respectively.

Figure 4:
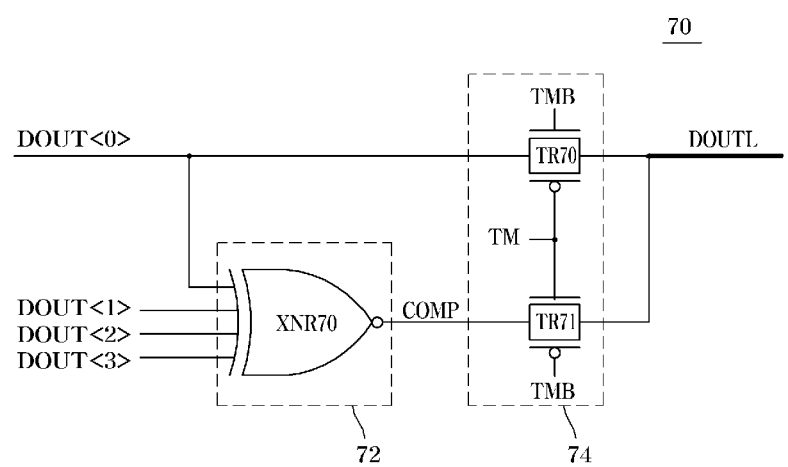
FIG. 4 is a circuit diagram of a data transmission unit of the semiconductor memory device illustrated in FIG. 3.

Referring to FIG. 4, the compression unit 70 includes a determination section 72 and a select output section 74. The determination section 72 includes a logic element XNR70, and the select output section 74 includes two transmission elements TR70 and TR71.

The compression unit 70 is configured to compare the first to fourth output data DOUT<0:3> and generate a comparison signal COMP. The select output section 74 is configured to output the first output data DOUT<0> to an output data line DOUTL when the test signal TM is deasserted to a logic low level, and output the comparison signal COMP to the output data line DOUTL when the test signal TM is asserted to a logic high level. The signal TMB is an inverted version of the test signal TM.

The first to fourth output drivers 80 to 83 are configured to receive the comparison signal COMP and the second to fourth output data DOUT<1:3> and drive first to fourth data pads (not illustrated) to output the first to fourth data DQ<0:3>, respectively.

The operation of the semiconductor memory device including the data compression test circuit configured in such a manner will be described. The operation may be divided into a case in which the test signal TM is deasserted and a case in which the test signal TM is asserted.

First, when the test signal TM is deasserted to a logic low level, a case in which the first to fourth data DQ<0:3> are stored and a case in which the first to fourth data DQ<0:3> are outputted will be described as follows.

When receiving the first to fourth data DQ<0:3>, the first to fourth input buffers 10 to 13 buffer the first to fourth data DQ<0:3> and generate the first to fourth input data DIN<0:3>, respectively. The data transmission unit 20 and the first to third transmission elements TR1 to TR3 transmit the first to fourth input data DIN<0:3> to the first to fourth global line drivers 30 to 33, respectively. It may be noted that in this mode, the first to third interlines ML1, ML2, and ML3 are isolated from each other to prevent undesired shorting of the signals from the data transmission unit 20 and the first to third transmission elements TR1 to TR3. The first to fourth global line drivers 30 to 33 receive the first to fourth input data DIN<0:3> and drive the first to fourth global lines to generate the first to fourth global line data GIO<0:3>, respectively. The first to fourth write drivers 40 to 43 receive the first to fourth global line data GIO<0:3> and drive the first to fourth local lines to generate the first to fourth local line data LIO<0:3>, respectively. The first to fourth local line data LIO<0:3> are stored in cells through a bit line (not illustrated).

When outputting the first to fourth data DQ<0:3>, the first to fourth input/output sense amplifiers 50 to 53 amplify the first to fourth local line data LIO<0:3> to generate the first to fourth output global line data HIO<0:3>, respectively. The first to fourth pipe latches 60 to 63 latch the first to fourth output global line data HIO<0:3> and generate the first to fourth output data DOUT<0:3>, respectively. The determination section 72 of the compression unit 70 receives the first to fourth output data DOUT<0:3> and generates a comparison signal COMP. However, since the test signal TM is deasserted to a logic low level, the select output section 74 of the compression unit 70 outputs the first output data DOUT<0> to the output data line DOUTL. Accordingly, the first to fourth output drivers 80 to 83 receive the first to fourth output data DOUT<0:3> and drive the first to fourth data pads (not illustrated) to output the first to fourth data DQ<0:3>, respectively.

Next, when the test signal TM is asserted to a logic high level, a case in which the first data DQ<0> is stored and a case in which the first data DQ<0> is outputted will be described as follows.

When receiving the first to fourth data DQ<0:3>, the first to fourth output buffers 10 to 13 buffer the first to fourth data DQ<0:3> and generate the first to fourth input data DIN<0: 3>, respectively. The data transmission unit 20 transmits the first input data DIN<0> to the first to fourth global line drivers 30 to 33. It may be noted that in this mode, the first to third interlines ML1, ML2, and ML3 are effectively shorted together so that the signal from the data transmission unit 20 may be communicated to the second to fourth global line drivers 31, 32, and 33. It may also be noted that in this mode the signal at the first data line DL0 is effectively the same signal as the signal at the first interline ML1, and hence the same signal as the signal at the second and third interlines ML2 and ML3. The first to fourth global line driver 30 to 33 receive the first input data DIN<0> and drive the first to fourth global lines to generate the first to fourth global line data GIO<0:3>, respectively. The first to fourth write drivers 40 to 43 receive the first to fourth global line data GIO<0:3> and drive the first to fourth local lines to generate the first to fourth local line data LIO<0:3>, respectively. The first to fourth local line data LIO<0:3> are stored in cells. Here, since the first input data DIN<0> are inputted to the first to fourth global line drivers 30 to 33, the first input data DIN<0> is identical to the first to fourth global line data GIO<0:3> and the first to fourth local line data GIO<0:3>.

When transmitting the first to fourth data DQ<0:3>, the first to fourth input/output sense amplifiers 50 to 53 amplify the first to fourth local line data LIO<0:3> and generate the first to fourth output global line data HIO<0:3>, respectively. The first to fourth pipe latch 60 to 63 latch the first to fourth output global line data HIO<0:3> and generate the first to fourth output data DOUT<0:3>, respectively. The determination section 72 of the compression unit 70 receives the first to fourth output data DOUT<0:3> and generates the compression signal COMP, and the select output section 74 of the compression unit 70 outputs the compression signal COMP to the output data line DOUTL in response to the test signal TM at a logic high level. The first output driver 80 outputs the compression signal COMP to a first data pad (not illustrated). The semiconductor memory device is determined to be normal when the compression signal COMP is at a logic high level, and determined to be abnormal when the compression signal COMP is at a logic low level. When the test signal TM is asserted, whether the second to fourth output drivers 81-83 are disabled or enabled may be design and/or implementation dependent.

As described above, since the semiconductor memory device in accordance with the embodiment of the present invention uses the line through which data are actually inputted and outputted, it is possible to provide a correct data compression test.

The embodiments of the present invention have been disclosed above for illustrative purposes. Those skilled in the art will appreciate that various modifications, additions, and substitutions are possible, without departing from the scope and spirit of the invention as disclosed in the accompanying claims. For example, although the illustrations have been with four data bits, the invention need not be so limited. The invention is not dependent on a specific number of bits.

What is claimed is:

1. A semiconductor memory device comprising:
    a data transmission unit configured to transmit first input data to only a first global line driver or to the first global line driver and a second global line driver in response to a test signal; and
    a transmission element configured to transmit second input data only to the second global line driver in response to the test signal,
    wherein the data transmission unit is configured to transmit the first input data to the first and the second global line drivers when the test signal is asserted, and transmit the first input data only to the first global line driver when the test signal is deasserted, and the transmission element is configured to transmit the second input data to the second global line driver when the test signal is deasserted and not transmit the first input data to the second global line driver when the test signal is asserted.

2. The semiconductor memory device of claim 1, wherein the data transmission unit comprises:
    a first transmission section configured to transmit the first input data only to the first global line driver when the test signal is deasserted; and
    a second transmission section configured to transmit the first input data to the first and second global line drivers when the test signal is asserted.

3. The semiconductor memory device of claim 1, further comprising a first input buffer configured to buffer first received data to generate the first input data,
    wherein the data transmission unit is coupled to an output terminal of the first input buffer.

4. The semiconductor memory device of claim 1, further comprising a second input buffer configured to buffer second received data to generate the second input data,
    wherein the transmission element is coupled to an output terminal of the second input buffer.

5. A semiconductor memory device comprising:
    a first data line coupled to a first global line driver;
    a second data line coupled to a second global line driver;
    a first transmission section configured to transmit the first input data to the first and second global line drivers when the test signal is asserted;
    a second transmission section configured to transmit the first input data to only the first global line driver when the test signal is deasserted; and
    a transmission element configured to transmit second input data only to the second data line in response to the test signal.

6. The semiconductor memory device of claim 5, further comprising a first input buffer configured to buffer first received data to generate the first input data,
    wherein the data transmission unit is coupled to an output terminal of the first input buffer.

7. The semiconductor memory device of claim 5, further comprising a second input buffer configured to buffer second received data to generate the second input data,
    wherein the transmission element is coupled to an output terminal of the second input buffer.

8. The semiconductor memory device of claim 5, further comprising circuitry to electrically isolate the first data line from the second data line when the test signal is deasserted.

* * * * *